(12) United States Patent
Dong et al.

(10) Patent No.: US 10,263,051 B2
(45) Date of Patent: Apr. 16, 2019

(54) OLED TOUCH-CONTROL SUBSTRATE AND FABRICATION METHOD THEREOF, AND DISPLAY APPARATUS

(71) Applicants: BOE TECHNOLOGY GROUP CO., LTD, Beijing (CN); Chengdu BOE Optoelectronics Technology Co., Ltd., Chengdu (CN)

(72) Inventors: Xiangdan Dong, Beijing (CN); Weiyun Huang, Beijing (CN)

(73) Assignees: BOE TECHNOLOGY GROUP CO., LTD., Beijing (CN); Chengdu BOE Optoelectronics Technology Co., Ltd., Chengdu (CN)

( * ) Notice: Subject to any disclaimer, the term of this patent is extended or adjusted under 35 U.S.C. 154(b) by 294 days.

(21) Appl. No.: 15/031,068

(22) PCT Filed: Dec. 10, 2015

(86) PCT No.: PCT/CN2015/097029
§ 371 (c)(1),
(2) Date: Apr. 21, 2016

(87) PCT Pub. No.: WO2016/155354
PCT Pub. Date: Oct. 6, 2016

(65) Prior Publication Data
US 2018/0158875 A1   Jun. 7, 2018

(30) Foreign Application Priority Data

Mar. 30, 2015   (CN) .......................... 2015 1 0144816

(51) Int. Cl.
G06F 3/041 (2006.01)
G06F 3/044 (2006.01)
(Continued)

(52) U.S. Cl.
CPC ............ H01L 27/323 (2013.01); G06F 3/044 (2013.01); G06F 3/0412 (2013.01);
(Continued)

(58) Field of Classification Search
CPC ............... H01L 27/323; H01L 27/3276; H01L 27/3288; H01L 51/56; G06F 3/0412; G06F 2203/04103; G06F 3/044
See application file for complete search history.

(56) References Cited

U.S. PATENT DOCUMENTS

2008/0299496 A1* 12/2008 Hirakata ............ B23K 26/0661
430/319
2011/0316802 A1* 12/2011 Choi ....................... G06F 3/041
345/173
(Continued)

FOREIGN PATENT DOCUMENTS

CN    103887324 A  *  6/2014
CN    103887324 A      6/2014
(Continued)

OTHER PUBLICATIONS

The World Intellectual Property Organization (WIPO) International Search Report for PCT/CN2015/097029 dated Mar. 9, 2016 pp. 1-5.
(Continued)

Primary Examiner — Srilakshmi K Kumar
Assistant Examiner — Brent D Castiaux
(74) Attorney, Agent, or Firm — Westerman, Hattori, Daniels & Adrian

(57) ABSTRACT

An organic light-emitting diode (OLED) touch-control substrate is provided. The organic light-emitting diode (OLED) touch-control substrate comprises a plurality of OLEDs, each of the OLEDs having a first electrode, a second electrode and a light-emitting layer between the first electrode and the second electrode; a plurality of first touch-
(Continued)

control electrodes disposed in a same layer with the first electrodes and insulated from the first electrode lines; and a plurality of second touch-control electrodes disposed in a same layer with the second electrodes and insulated from the second electrode lines and the first touch-control electrodes.

18 Claims, 7 Drawing Sheets

(51) Int. Cl.
    *H01L 27/32*     (2006.01)
    *H01L 51/56*     (2006.01)

(52) U.S. Cl.
    CPC ...... *H01L 27/3276* (2013.01); *H01L 27/3288* (2013.01); *H01L 51/56* (2013.01); *G06F 2203/04103* (2013.01)

(56) References Cited

U.S. PATENT DOCUMENTS

2013/0307800 A1    11/2013    Cheng et al.
2016/0109988 A1*    4/2016    Wang ............... G06F 3/046
                                                      345/173

FOREIGN PATENT DOCUMENTS

| CN | 103927043 A | | 7/2014 |
|---|---|---|---|
| CN | 203858617 U | | 10/2014 |
| CN | 104182112 A | * | 12/2014 |
| CN | 104182112 A | | 12/2014 |
| CN | 104346010 A | | 2/2015 |
| CN | 104393025 A | | 3/2015 |
| CN | 104461092 A | | 3/2015 |
| CN | 104795425 A | | 7/2015 |

OTHER PUBLICATIONS

The State Intellectual Property Office of the People's Republic of China (SIPO) Office Action 1 for 201510144816.6 dated Dec. 7, 2015 pp. 1-9.

* cited by examiner

US 10,263,051 B2

OLED TOUCH-CONTROL SUBSTRATE AND FABRICATION METHOD THEREOF, AND DISPLAY APPARATUS

CROSS-REFERENCES TO RELATED APPLICATIONS

This application is a national phase entry under 35 U.S.C. § 371 of International Application No. PCT/CN2015/097029, filed on Dec. 10, 2015, which claims priority to Chinese Patent Application No. 201510144816.6, filed on Mar. 30, 2015. The above enumerated patent applications are incorporated by reference herein in their entirety.

FIELD OF THE INVENTION

The present invention generally relates to the field of the display technologies and, more particularly, to an OLED touch-control substrate and fabrication methods thereof, and a display apparatus.

BACKGROUND

Organic Light-Emitting Diode (OLED) displays have many advantages, including ultra-thin, light weight, low cost, wide viewing-angle, self-emitting, continuously adjustable emitting color, fast response speed, low driving voltage, low power-consumption, broad working temperature range, simple manufacturing process, high light-emitting efficiency, and flexible display, etc. Thus, the OLED has become a new generation of display device technology.

The basic structure of an OLED includes an anode, a cathode, and a light-emitting layer between the anode and the cathode. Light-emitting of OLED is caused by the injection and combination of carriers through the anode and the cathode when an external electric field is applied on the light-emitting layer. Specifically, the carriers, e.g., holes and electrons, are transported between the anode to the cathode under the electric field; and combined into exitons when the holes and the electrons meet within the light-emitting layer. The exitons release energy to activate the light-emitting molecules. Then, the activated light-emitting molecules emit visible light by a radiation relaxation process.

In the existing display technologies, OLED touch-control substrates usually formed by a plug-in architecture. That is, a touch-control screen and an OLED display are fabricated separately, and then bonded together. Such a technology has many disadvantages, such as large module thickness, low light transparency and high production cost, etc.

The disclosed device structures, methods and systems are directed to at least partially solve one or more problems set forth above and other problems.

BRIEF SUMMARY OF THE DISCLOSURE

One aspect of the present disclosure includes providing an organic light-emitting diode (OLED) touch-control substrate and a fabrication method thereof. The organic light-emitting diode (OLED) touch-control substrate comprises a plurality of OLEDs, each of the OLEDs having a first electrode, a second electrode and a light-emitting layer between the first electrode and the second electrode; a plurality of first touch-control electrodes disposed in a same layer with the first electrodes and insulated from the first electrodes; and a plurality of second touch-control electrodes disposed in a same layer with the second electrodes and insulated from the second electrodes and the first touch-control electrodes.

The first touch-control electrodes and the second touch-control electrodes configured for realizing a touch-control function are embedded in the OLED touch-control substrate. Thus, the thickness of the modules of the OLED touch-control substrate may be significantly reduced; the light transmittance may be increased; and the production cost may be reduced.

Optionally, the organic light-emitting diode (OLED) touch-control substrate further includes a first dielectric layer disposed between the layer having the first touch-control electrodes and the first electrodes and the layer having the second touch-control electrodes and the second electrodes, having via holes at positions corresponding to the light-emitting layer.

Optionally, the organic light-emitting diode (OLED) touch-control substrate further includes a plurality of insulation blocks disposed at cross-positions of the first touch-control electrodes.

Optionally, one first touch-control electrode is disposed between at least two adjacent first electrode lines; and one second touch-control electrode is disposed between at least two adjacent second electrode lines Optionally, the OLEDs comprises passive matrix OLEDs (PMOLEDs) having a plurality of first electrode lines and second electrode lines, the first electrode lines electrically connecting the first electrodes, the second electrode lines connecting the second electrodes; the plurality of first touch-control electrodes are parallel to the plurality of first electrode lines and insulated from the plurality of the first electrode lines; and the plurality of second touch-control electrodes are parallel to the plurality of second electrode lines and insulated from the second electrode lines.

Optionally, the OLEDs comprises active matrix OLEDs (AMOLEDs); the plurality of first touch-control electrodes are electrically insulated from the plurality of first electrodes of the AMOLEDs; and a plurality of second electrode of the AMOLEDs are electrically connected.

Optionally, the organic light-emitting diode (OLED) touch-control substrate further includes thin film transistors for controlling the plurality of OLEDs.

Optionally, the organic light-emitting diode (OLED) touch-control substrate further includes gate lines connecting to gates of thin film transistors; and data lines connecting to sources of the thin film transistors.

Optionally, the first touch-control electrodes are parallel to one of the gate lines and the data lines; and the second touch-control electrodes are parallel to the other one of the gate lines and the data lines.

Optionally, the first electrodes are one of the anodes and the cathode; and the second electrodes are the other one of the anodes and the cathodes.

Optionally, the first touch-control electrodes are one of the driving electrode lines and sensing electrode lines; and the second touch-control electrodes are the other one of the driving electrodes and sensing electrodes.

Another aspect of the present disclosures is providing a method for fabricating an OLED touch-control substrate. The method comprises forming a plurality of first touch-control electrodes and a plurality of first electrodes of OLEDs insulated from the plurality of first touch-control electrodes in a same layer on a substrate; forming a light-emitting layer on the plurality of first touch-control electrodes and the plurality of first electrodes; and forming a plurality of second touch-control electrodes and a plurality of second electrodes insulated from the second touch-control electrodes in a same layer on the light-emitting layer.

The thicknesses of the modules of the OLED touch-control substrate fabricated by the disclosed method may be relatively small; and the light transmittance may be relatively large. Further, comparing with existing methods, the production cost may be relatively low.

Optionally, the method further includes forming a first insulation layer having a plurality of via holes corresponding to positions of the light-emitting layer of the OLEDs on the plurality of first touch-control electrodes and the plurality of first electrodes; and forming the light-emitting layer in each of the openings.

Optionally, the method further includes forming a plurality of insulation blocks at cross positions of the first touch-control electrodes and the second touch-control electrodes.

Optionally, the OLEDs are passive matrix OLEDs (PMOLEDs) having a plurality of first electrode lines and second electrode lines; the plurality of first touch-control electrodes are parallel to the plurality of first electrode lines and insulated from the first electrode lines; and the plurality of second touch-control electrodes are parallel to the plurality of second electrode lines and insulated from the second electrode lines.

Optionally, the OLEDs comprises active matrix OLEDs (AMOLEDs; the plurality of first touch-control electrodes are electrically insulated from the plurality of first electrodes; and the plurality of second electrodes are electrically connected.

Optionally, the method further includes forming a plurality of thin-film transistors for controlling the plurality of OLEDs on the substrate; and forming a second insulation layer having a plurality of openings corresponding to drains of thin-film transistors connecting the drains with the first electrodes.

Optionally, the first electrodes are one of the anodes and the cathodes; and the second electrodes are the other one of the anodes and the cathodes Optionally, the first touch-control electrodes are one of the driving electrodes and the sensing electrode; and the second touch-control electrodes are the other one of the anodes and the sensing electrodes.

Another aspect of the present disclosure includes providing a display apparatus. The display apparatus comprises at least the disclosed OLED touch-control substrate.

Other aspects of the present disclosure can be understood by those skilled in the art in light of the description, the claims, and the drawings of the present disclosure.

DETAILED DESCRIPTION

For those skilled in the art to better understand the technical solution of the invention, reference will now be made in detail to exemplary embodiments of the invention, which are illustrated in the accompanying drawings. Wherever possible, the same reference numbers will be used throughout the drawings to refer to the same or like parts.

In order to reduce the thicknesses of the modules of OLED touch-control substrate, and to increase the light transmittance and lower the production cost, an OLED touch-control substrate and a fabrication process thereof are provided in the present disclosure.

Figure 1:
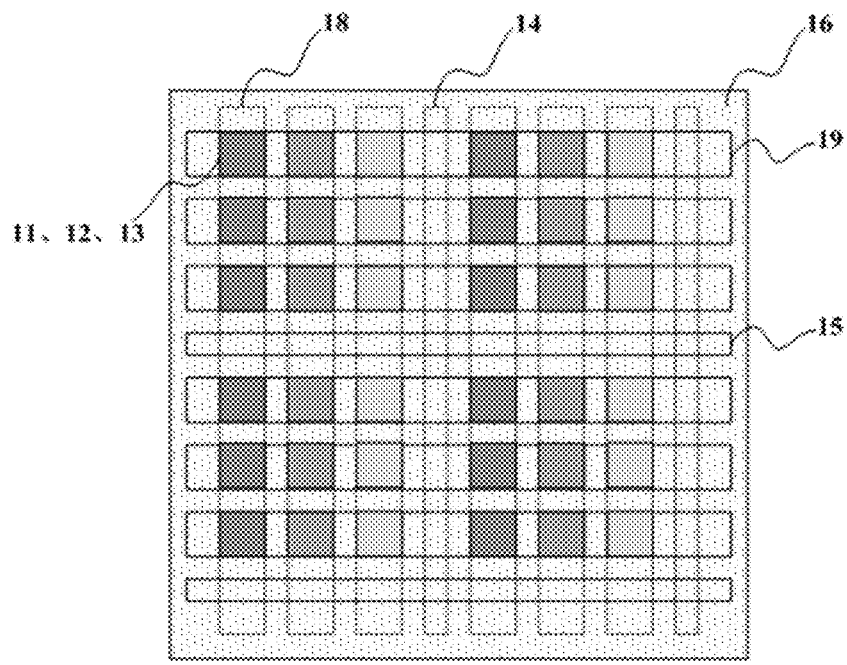
FIG. 1 illustrates an exemplary PMOLED touch-control substrate according to the disclosed embodiments.

According to driving methods, OLEDs can be categorized as Passive Matrix OLEDs (PMOLEDs) and Active Matrix OLED (AMOLEDs). For PMOLEDs, the anodes and cathodes form a matrix, and pixels in the matrix are turned on/off by a scanning mode. Each pixel is operated under a short pulse mode; and the emission of light in the PMOLEDs is a transient process with a relatively high light intensity. FIG. 1 illustrates the top view of an exemplary PMOLED touch-control substrate according to the disclosed embodiments.

As shown in FIG. 1, the PMOLED touch-control substrate may include a plurality of OLEDs (not labeled). The plurality of OLEDs may be distributed as an array, i.e., a plurality of rows and a plurality of columns. Each of the plurality of OLEDs may include a first electrode 11, a second electrode 12, and a light-emitting layer 13 between the first electrode 11 and the second electrode 12.

Further, the PMOLED touch-control substrate may also include a plurality of first touch-control electrodes 14. The plurality of touch-control electrodes 14 may be disposed on a same layer with the first electrodes 11.

Further, the PMOLED touch-control substrate may also include a plurality of second touch-control electrodes 15. The plurality of the second touch-control electrodes 15 may be disposed on a same layer with the second electrodes 12.

Each row or column of first electrode 11 may be electrically connected by a first electrode line 18; and each row or column of the second electrodes 12 may be electrically by a second electrode line 19.

The first touch-control electrodes 14 and the second touch-control electrodes 15 may be electrically insulated by any appropriate structures. In one embodiment, as shown in FIG. 1, the PMOLED may include a first insulation layer 16 between the layer having the first electrodes 11 and the first touch-control electrodes 14 and the layer having the second electrodes 12 and the second touch-control electrodes 15; and the first insulation 16 may be used to electrically insulate the first touch-control electrodes 14 and the second touch-control electrodes 15. The portions of the first insulation layer 16 corresponding to the light-emitting layers 13 may have via holes (not labeled in FIG. 1). That is, the light-emitting layers 13 may be in the via holes of the first insulation layer 16.

In certain other embodiments, insulation blocks (not labeled) may be formed between portions of the first touch-control electrodes 14 and the portions of the second touch-control electrodes 15 at the cross positions of the first touch-control electrodes 14 and the second touch-control electrodes 15. Thus, the first touch-control electrodes 14 and the second touch-control electrodes 15 may be electrically insulated.

The OLEDs may be top-emitting OLEDs, or bottom-emitting OLEDs. The OLEDs may include red OLEDs, green OLEDs, or white OLEDs, etc. In the OLED layer, PMOLED display may also include transport layer and shared layers, etc.

According to the type of the OLEDs, the first electrodes 11 may be anodes and the second electrodes 12 may be cathodes. In certain other embodiments, the first electrodes 11 may be cathodes and the second electrodes 12 may be anodes.

In a PMOLED display structure, the first electrodes 11 may be close to the substrate. In certain other embodiments, the second electrodes 12 may be close to the substrate.

Further, as electrode lines for realizing a touch-control function, the first touch-control electrodes 14 may be driving electrode lines, and the second touch-control electrodes 15 may be sensing electrode lines. In certain other embodiments, the first touch-control electrodes 14 may be touch-control sensing electrode lines and the second touch-control electrodes 15 may be driving electrode lines.

In a PMOLED display structure, the first touch-control electrodes 14 may be close to the substrate. In certain other embodiments, the second touch-control electrodes 15 may be close to the substrate.

Further, as shown in FIG. 1, the PMOLED may also include a plurality of first electrode lines 18, and a plurality of second electrode lines 19. One first electrode line 18 may electrically connect one row, or one column of first electrodes 11; and one second electrode line 19 may electrically connect one row or one column of second electrodes 12. The plurality of first touch-control electrodes 14 may be parallel to the plurality of first electrode lines 18; and the plurality of second touch-control electrodes 15 may be parallel to the plurality of second electrode lines 19.

The number of first electrode lines 18 and the second electrode lines 19 corresponding to one OLED may be any appropriate value. For example, the light-emitting layer 13 of one OLED may be disposed at the cross-position of a first electrode line 18 and a second electrode line 19, as shown in FIG. 1.

The line density of the first touch-control electrodes 14 and the second touch-control electrodes 15 may be any appropriate value. For example, one first touch-control electrode line 14 may be disposed between two adjacent first electrode lines 18, or one first touch-control electrode line 14 may be disposed between two sets of first electrode lines 18; and each set of first electrode lines 18 may include a plurality of first electrode lines 18. Similarly, one second touch-control electrode line 15 may be disposed between two adjacent second electrode lines 19, or one second touch-control electrode line 15 may be disposed between two sets of second electrode lines 19; and each set of second electrode lines 19 may include a plurality of second electrode lines 19.

Figure 2:
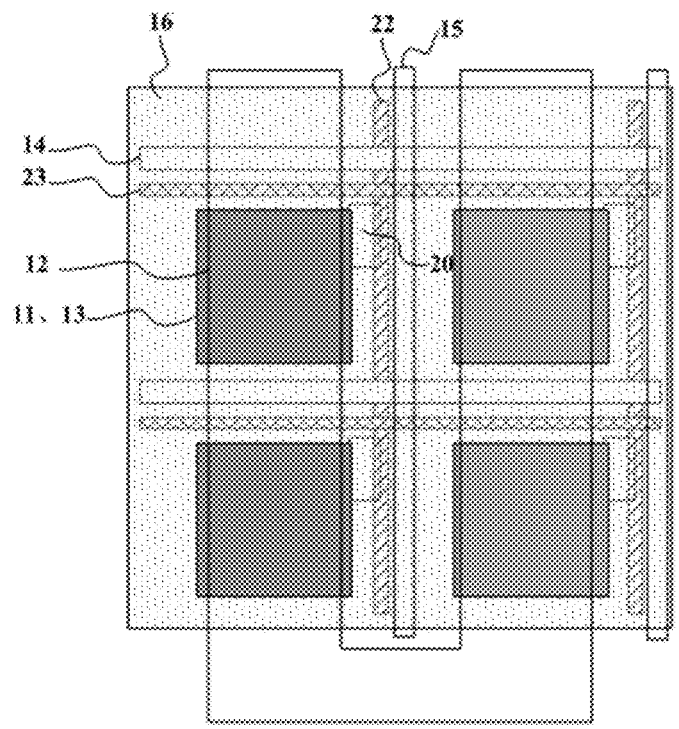
FIG. 2 illustrates an exemplary AMOLED touch-control substrate according to the disclosed embodiments.

AMOLEDs utilize independent Thin Film Transistors (TFTs) to drive each pixel; and each pixel is able to independently and continuously emit light. FIG. 2 illustrates the top view of an exemplary AMOLED touch-control substrate according to the disclosed embodiments. As shown in FIG. 2, the AMOLED touch-control substrate may include a plurality of OLEDs (not labeled). The plurality of OLEDs may be distributed as an array, i.e., a plurality of rows and a plurality of columns. Each of the plurality of OLEDs may include a first electrode 11, a second electrode 12, and a light-emitting layer 13 between the first electrode 11 and the second electrode 12.

Further, the AMOLED touch-control substrate may also include a plurality of first touch-control electrodes 14. The plurality of touch-control electrodes 14 may be disposed on a same layer with the first electrodes 11.

Further, the AMOLED touch-control substrate may also include a plurality of second touch-control electrodes 15. The plurality of second touch-control electrodes 15 may be disposed on a same layer with the second electrodes 12.

The first touch-control electrodes 14 and the second touch-control electrodes 15 may be electrically insulated by any appropriate structures. In one embodiment, as shown in FIG. 2, the AMOLED touch-control substrate may include a first insulation layer 16 between the layer having the first electrodes 11 and the first touch-control electrodes 14 and the layer having the second electrodes 12 and the second touch-control electrodes 15; and the first insulation layer 16 may be used to electrically insulate the first touch-control electrodes 14 and the second touch-control electrodes 15. The portions of the first insulation layer 16 corresponding to the light-emitting layers 13 may have via holes (not labeled in FIG. 2). That is, the light-emitting layers 13 may be in the via holes of the first insulation layer 16.

In certain other embodiments, insulation blocks (not labeled) may be formed between portions of the first touch-control electrodes 14 and the portions of the second touch-control electrodes 15 at the cross-positions of the first touch-control electrodes 14 and the second touch-control electrodes 15. Thus, the first touch-control electrodes 14 and the second touch-control electrodes 15 may be electrically insulated.

The OLEDs may be top-emitting OLEDs, or bottom-emitting OLEDs. The OLEDs may include red OLEDs, green OLEDs, or white OLEDs, etc. In the OLED layer, an AMOLED display may also include transport layers and shared layers, etc.

According to the type of the OLEDs, the first electrodes 11 may be anodes and the second electrodes 12 may be cathodes. In certain other embodiments, the first electrodes 11 may be cathodes and the second electrodes 12 may be anodes.

In an AMOLED touch-control substrate structure, the first electrodes 11 may be close to the substrate. In certain other embodiments, the second electrodes 12 may be close to the substrate.

Further, as electrode lines for realizing a touch-control function, the first touch-control electrodes 14 may be driving electrode lines, and the second touch-control electrodes 15 may be touch-sensing electrode lines. In certain other embodiments, the first touch-control electrodes 14 may be touch-sensing electrode lines and the second touch-control electrodes 15 may driving electrode lines.

In an AMOLED display structure, the first touch-control electrodes 14 may be close to a substrate. In certain other embodiments, the second touch-control electrodes 15 may be close to a substrate.

Further, as shown in FIG. 2, the first electrodes 11 of the plurality of OLEDs may be insulated from each other; and the second electrodes 12 of the plurality of second electrodes 12 may be electrically connected. Further, the AMOLED touch-control substrate may include TFTs 20 for controlling the corresponding OLEDs.

Specifically, as shown in FIG. 2, the drain (not labeled) of the TFTs 20 may electrically connect with the first electrodes 11. The OLEDs may be turned on or off by controlling the TFTs 20.

Further, as shown in FIG. 2, the AMOLED touch-control substrate may also include gate lines 22 and data lines 23. The sources of TFTs 20 may electrically connect with the data lines 23; and the gates of the TFTs 20 may electrically connect with the gate lines 23. The first touch-control electrodes 14 may be parallel to the data lines 23; and the second touch-control electrodes 15 may be parallel to the gate lines 22. In certain other embodiments, the first touch-control electrodes 14 may be parallel to the gate lines 22; and the second touch-control electrodes 15 may be parallel to the data lines 23.

Therefore, as shown in FIG. 1 and FIG. 2, in the PMOLED and the AMOLED, the first touch-control electrodes 14 and the second touch-control electrodes 15 configured to realize a touch-control function may be embedded in the OLED display. Comparing with the existing technologies, the thickness of the modules of the OLED touch-control substrate may be significantly reduced, the light transmittance may be increased; and the production cost may be reduced.

Figure 3:
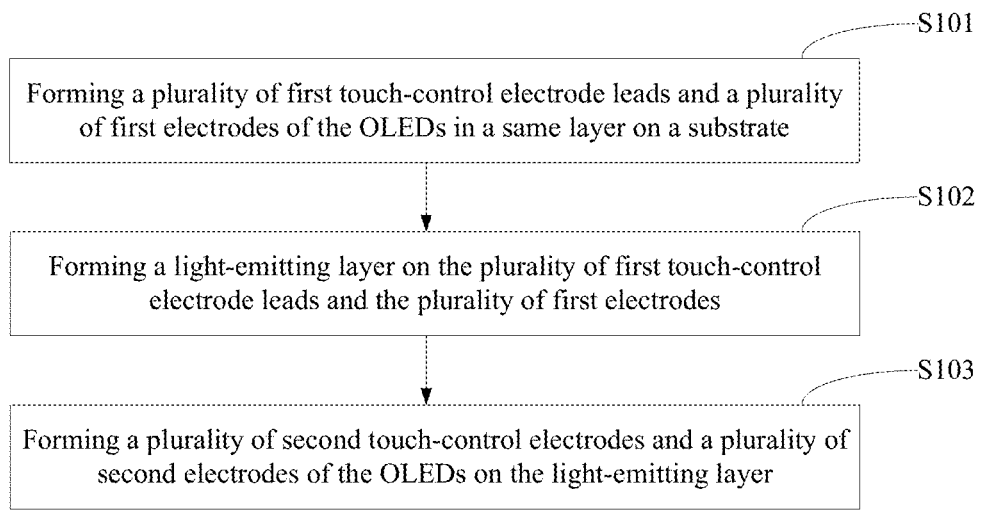
FIG. 3 illustrates an exemplary fabrication process of an OLED display according to the disclosed embodiments.
Figure 4A:
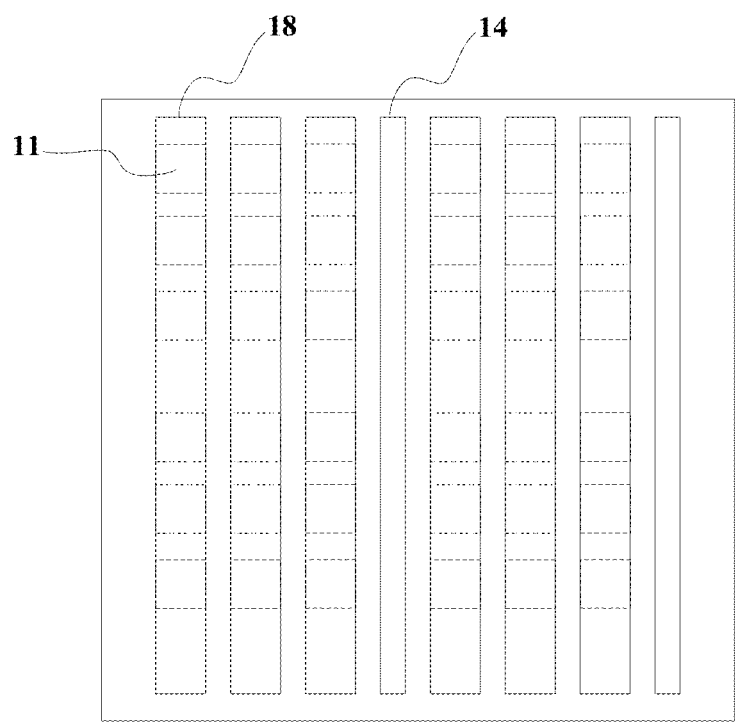
FIGS. 4a~4c illustrate structures corresponding to certain stages of an exemplary fabrication process of a PMOLED touch-control substrate according to the disclosed embodiments.
Figure 4B:
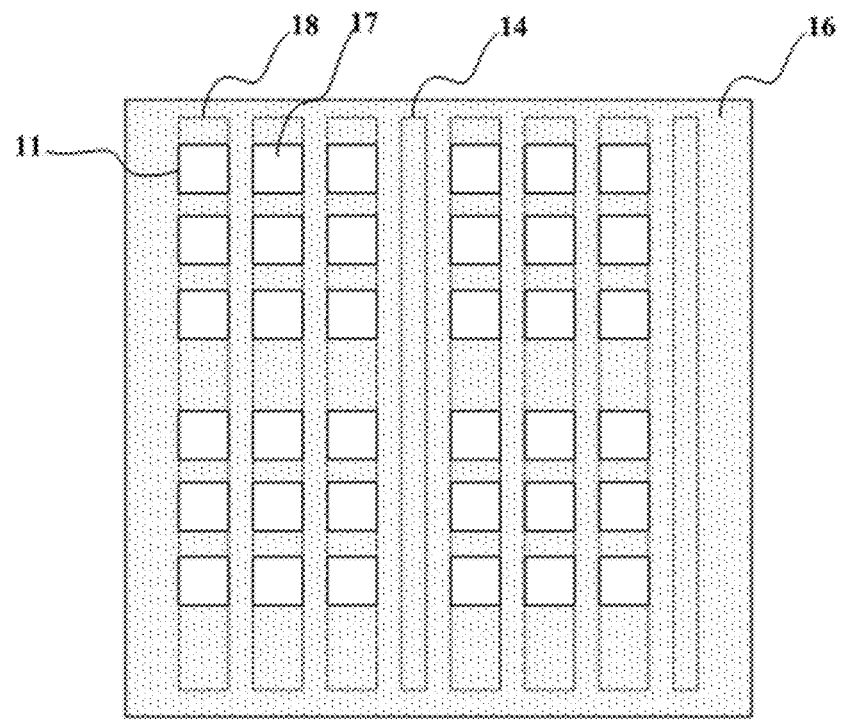
Figure 4C:
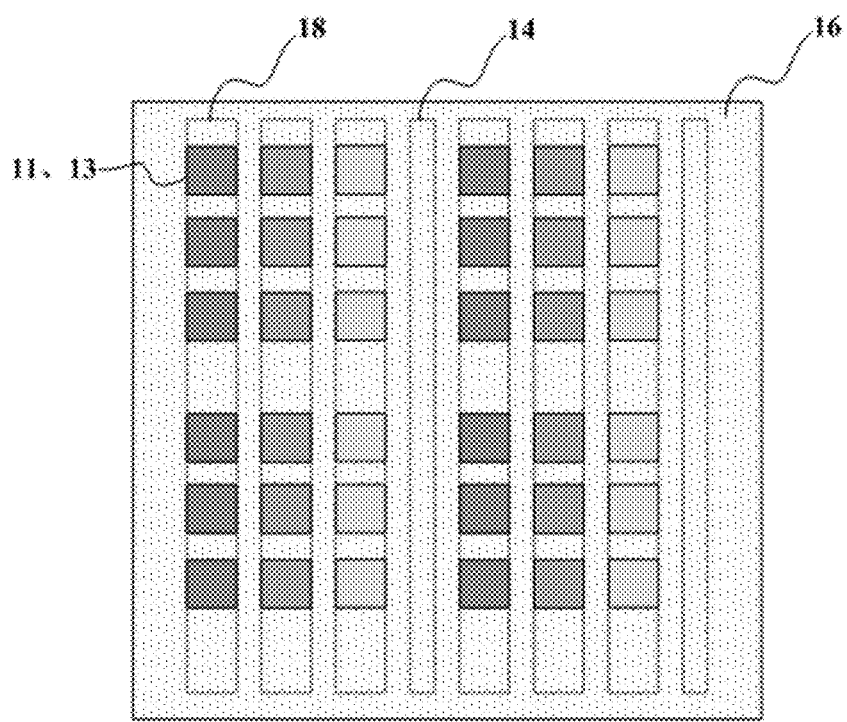

FIG. 3 illustrates an exemplary fabrication process of an OLED touch-control substrate. FIGS. 4a~4c illustrate structures corresponding certain stages of the exemplary fabrication for forming a PMOLED touch-control substrate.

As shown in FIG. 3, at the beginning of the fabrication process, a plurality of first touch-control electrodes and a plurality of first electrodes of the PMOLEDs may be formed on a substrate (S101). FIG. 4a illustrates a corresponding structure.

As shown in FIG. 4a, a substrate (not labeled) is provided; and a plurality of first touch-control electrodes 14 and a plurality of first electrode lines 18 may be formed. The plurality of first touch-control electrodes 14 may be parallel to each other; and the plurality of first electrode lines 18 may be parallel to each other. The dashed areas on the first electrode lines 18 may be corresponding to the first electrodes 11 of the PMOLEDs. That is, the dashed areas of the first electrode lines 18 may be configured as the first electrodes 11 of the PMOLEDs, i.e., one light-emitting layer 13 may be subsequently formed on each of the dashed regions of the first electrode lines 18. Or, one first electrode line 18 may be used to electrically connect one row of first electrodes 11, or one column of first electrodes 11. Further, the plurality of first touch-control electrodes 14 and the plurality of first electrode lines 18 may be on a same layer, i.e., a surface of the substrate.

The plurality of first touch-control electrodes 14 and the plurality of first electrode lines 18 may be formed by a patterning process. For example, the plurality of first touch-control electrodes 14 and the plurality of first electrode lines 18 may be formed by forming a metal layer on the surface of the substrate; and followed by patterning the metal layer. In certain other embodiments, the plurality of first touch-control electrodes 14 and the plurality of first electrode lines 18 may be formed by a lift-off process.

After providing the substrate and forming the plurality of first touch-control electrodes 14 and the plurality of first electrode lines 18, a first insulation layer may be formed. FIG. 4b illustrates a corresponding structure.

As shown in FIG. 4b, a first insulation layer 16 may be formed on the plurality of first touch-control electrodes 14 and the plurality of first electrode lines 18. The first insulation layer 16 may have a plurality of via holes 17. The portions of the first electrode lines 18 exposed by the via holes 17 may be configured as the first electrodes 11 of the PMOLEDs. The via holes 17 may be used to subsequently form a light-emitting layer. Thus, the light-emitting layer may be formed on the first electrodes 11.

The first insulation layer 16 may be formed by a patterning process. Specifically, an insulation material layer may be formed on the plurality of first touch-control electrodes 14, the plurality of first electrode lines 18 and the substrate; and followed by etching the insulation material layer to expose the portion of the first electrode lines 18 corresponding to the first electrodes 11.

Returning to FIG. 3, after forming the first insulation layer 16, a light-emitting layer may be formed (S102). FIG. 4c illustrates a corresponding structure.

As shown in FIG. 4c, a light-emitting layer 13 is formed in each of the via holes 17. That is, a light-emitting layer 13 is formed on each of the first electrodes 11.

The light-emitting layer 13 may be formed by a patterning process. Specifically, a light-emitting material layer may be formed in the via holes 17 and on the first insulation layer 16; and followed by removing the portion of the light-emitting material layer on the first insulation layer 16. Thus, a light-emitting layer 13 is formed in each of the via holes 17, or on each of the first electrodes 11.

Returning to FIG. 3, after forming the light-emitting layer 13, a plurality of second touch-control electrodes and a plurality of second electrode lines may be formed (S103). A corresponding structure may refer to FIG. 1.

As shown in FIG. 1, a plurality of second touch-control electrodes 15 and a plurality of second electrodes lines 19 are formed on the first insulation layer 16 and the light-emitting layer 13. The plurality of second touch-control electrodes 15 and the plurality of second electrodes lines 19 may be on a same layer. The plurality of second touch-control electrodes 15 and the plurality of second electrode lines 19 may be parallel to each other. Further, the portions of the second electrode lines 19 contacting with the light-emitting layer 13 may be referred as second electrodes 12.

The plurality of second touch-control electrodes 15 and the plurality of second electrodes lines 19 may be formed by a patterning process. Specifically, a second material layer may be formed on the light-emitting layer 13 and the first insulation layer 16; and followed by patterning the second material layer to form the plurality of second touch-control electrodes 15 and the plurality of second electrodes lines 19. In certain other embodiments, the plurality of second touch-control electrodes 15 and the plurality of second electrodes lines 19 may be formed by a lift-off process.

FIGS. 5a~5f illustrate structures corresponding to certain stages of the exemplary fabrication process illustrated in FIG. 3 for forming an AMOLED touch-control substrate according to the disclosed embodiments.

Referring to FIG. 1 and FIG. 2, comparing with the PMOLED touch-control substrate, an AMOLED touch-control substrate may include TFTs 20, data lines 23, and gate lines 22. Further, the first electrodes 11 of the plurality of AMOLEDs may be electrically insulated; and the second electrodes 12 of the plurality of the AMOLEDs may be electrically connected. Thus, before forming the first touch-control electrodes 14 and the first electrode lines 18, a plurality of TFTs 20 may be formed on a substrate; and a second insulation layer may be formed on the TFTs. The portions of the second insulation layer corresponding to the drains of the TFTs 20 may have a plurality of corresponding via holes.

Figure 5A:
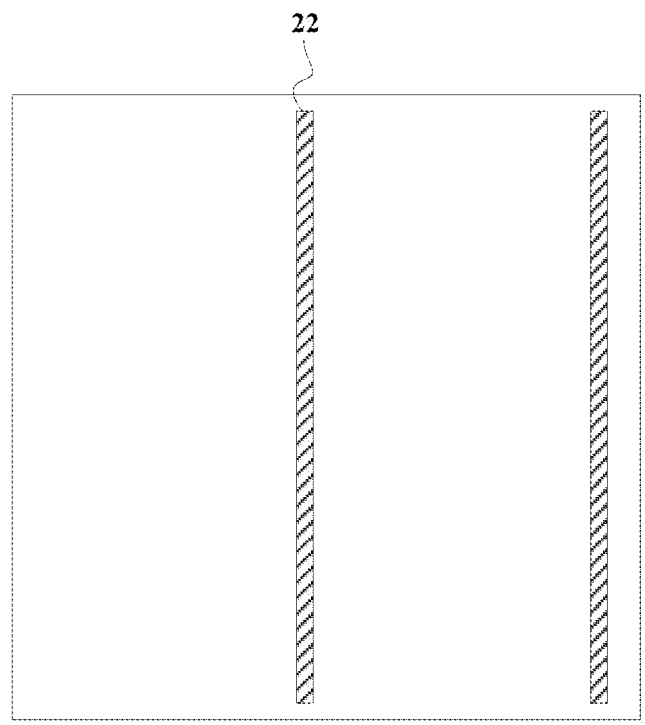
FIGS. 5a~5f illustrate structures corresponding to certain stages of an exemplary fabrication process of an AMOLED touch-control substrate according to the disclosed embodiments.

Specifically, at the beginning of the fabrication process, a plurality of gate lines 22 may be formed on a substrate. FIG. 5a illustrates a corresponding structure. As shown in FIG. 5a, the plurality of gate lines 22 may be parallel to each other. The plurality of gate lines 22 may be formed by a patterning process.

Further, after forming the plurality of gates lines 22, a gate dielectric layer (not shown) may be formed on the gate lines 22. The gate dielectric layer may be formed by any appropriate process; and may be patterned to be configured as the gate dielectric layer of the plurality of OLEDs.

Further, after forming the gate dielectric layer, an active layer (not shown) may be formed on the gate dielectric layer.

The active layer may be formed by any appropriate processes; and may be patterned to be configured as an active layer of the plurality of OLEDs.

Figure 5B:
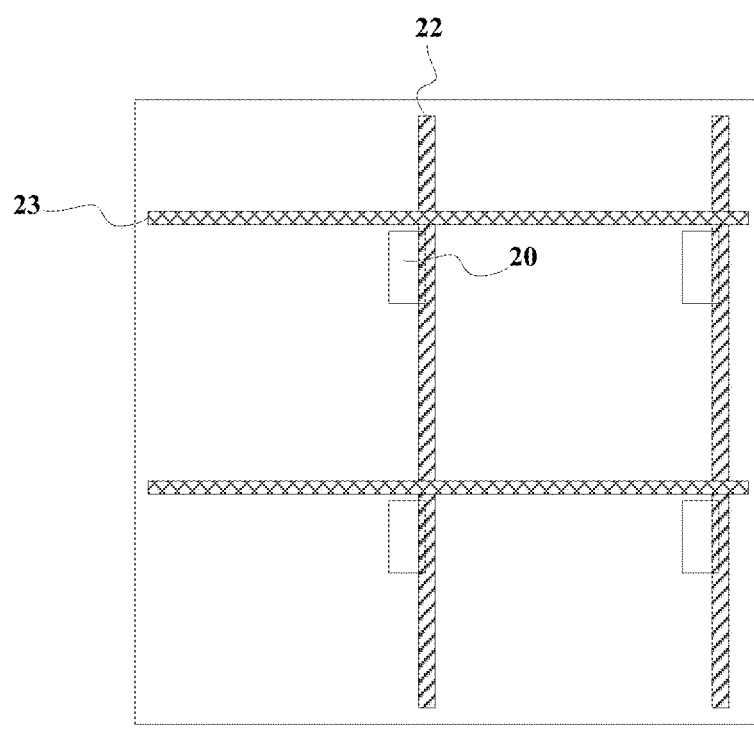

Further, after forming the active layer, a plurality of data lines 23 may be formed on the active layer. Thus, as shown in FIG. 5b, TFTs 20 may be formed. FIG. 5b illustrates the schematic of the TFTs 20.

Figure 5C:
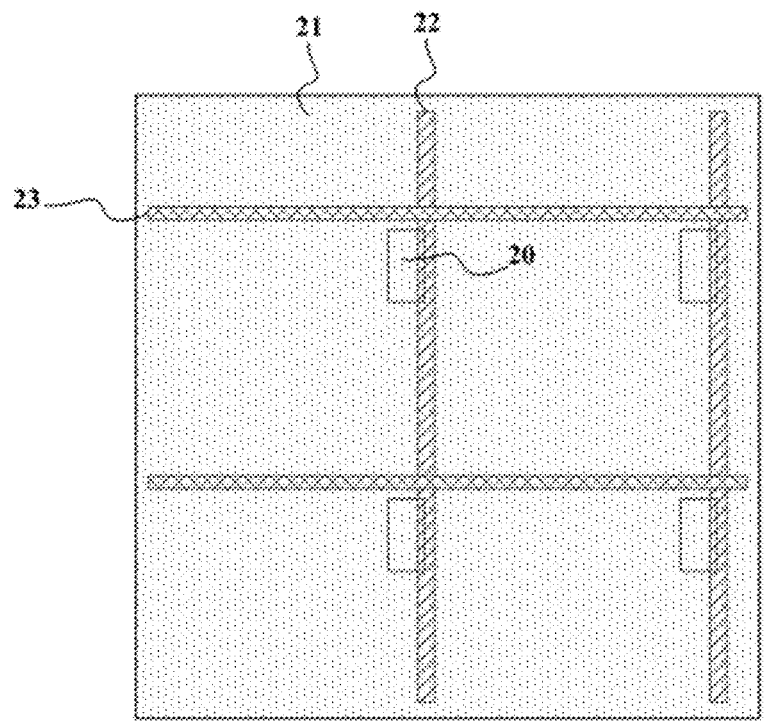

Further, as shown in FIG. 5c, after forming the TFTs, a second insulation layer 21 may be formed on the data lines 23 and the TFTs 20. The positions of the second insulation layer 21 corresponding to the drains of the TFTs 20 may have a plurality of via holes (not shown).

Figure 5D:
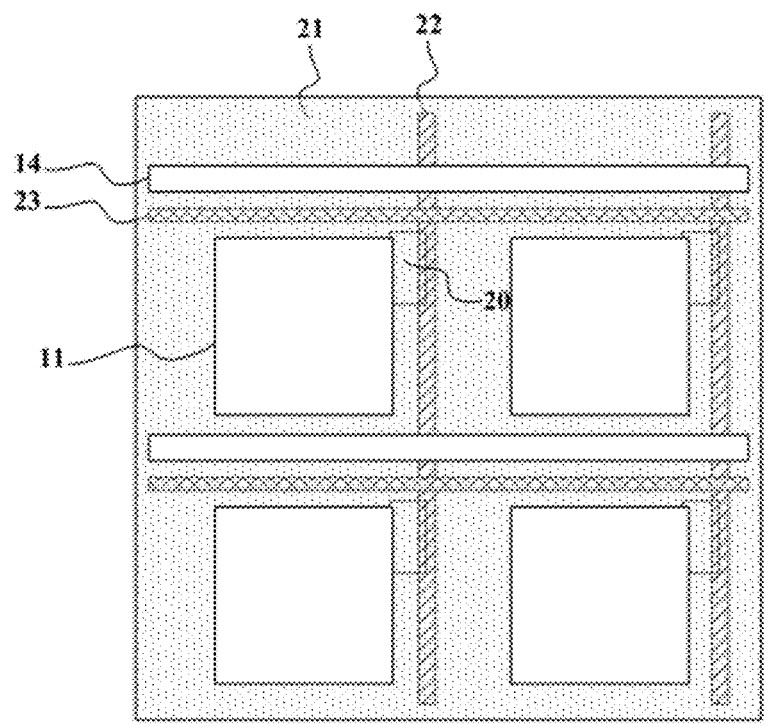

Further, as shown in FIG. 5d, after forming the second insulation layer 21, a plurality of first touch-control electrodes 14 and first electrodes 11 of the plurality of OLEDs may be formed on the substrate. The first electrodes 11 of the plurality of OLEDs may be separated. The plurality of first touch-control electrodes 14 and the plurality of first electrodes 11 may be on a same layer.

The plurality of first touch-control electrodes 14 and the first electrodes 11 of the plurality of the OLEDs may be formed by a patterning process. Specifically, a first material layer may be formed on the second insulation layer 21; and followed by patterning the first material layer. Thus, the plurality of first touch-control electrodes 14 and the first electrodes 11 of the plurality of OLEDs may be formed. In certain other embodiments, the plurality of first touch-control electrodes 14 and the first electrodes 11 of the plurality of OLEDs may be formed by a lift-off process.

Figure 5E:
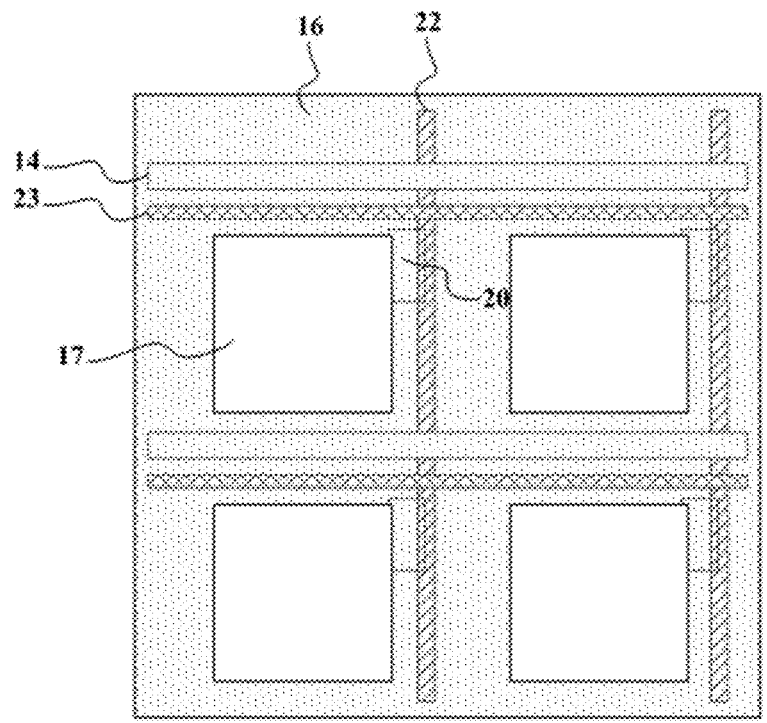

Further, as shown in FIG. 5e, after forming the plurality of first touch-control electrodes 14 and the first electrodes 11 of the plurality of OLEDs, a first insulation layer 16 may be formed on the plurality of first touch-control electrodes 14 and the first electrodes 11 of the plurality of OLEDs. The positions of the first insulation layer 16 corresponding to the subsequently formed light-emitting layer of OLEDs may have a plurality of via holes 17. That is, the first electrodes 11 may be exposed.

The first insulation layer 16 having the plurality of via holes 17 may be formed by a patterning process. Specifically, a first insulation material layer may be formed on the plurality of first touch-control electrodes 14, the first electrodes 11 of the plurality of OLEDs and the second insulation layer 23; and followed by etching the first insulation material layer to form the plurality of via holes 17.

Figure 5F:
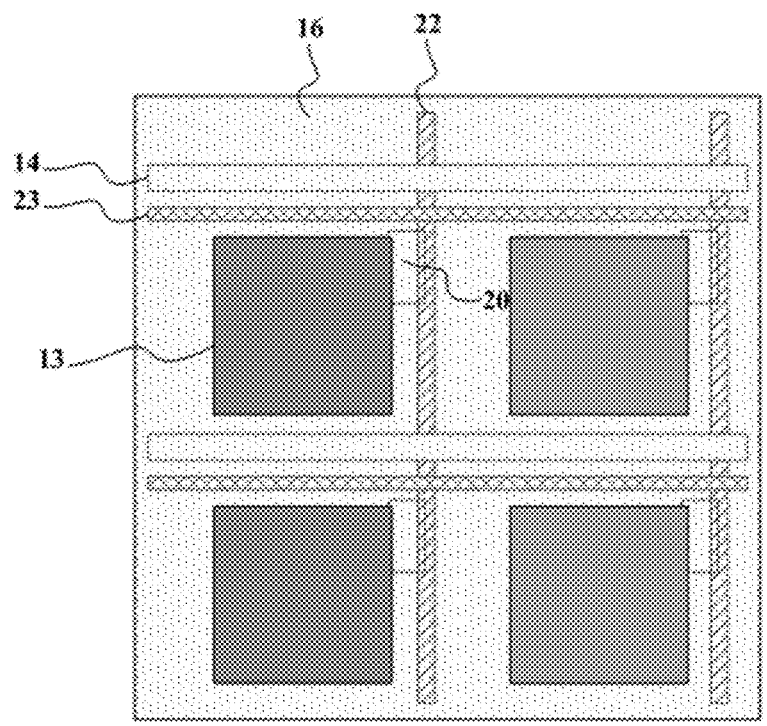

Further, as shown in FIG. 5f, after forming the first insulation layer 16 having the plurality of via holes 17, a light-emitting layer 13 is formed in each of the via holes 17. That is, the first light-emitting layer 13 is formed on the first electrodes 11.

The light-emitting layer 13 may be formed by a patterning process. Specifically, a light-emitting material layer may be formed on the first electrodes 11 and a portion of the first insulation layer 16; and followed by removing the portion of the light-emitting material layer on the first insulation layer 16. Thus, the light-emitting layer 13 may be formed on each of the first electrodes 11.

Further, after forming the light-emitting layer 13, a plurality of second touch-control electrodes 15 and second electrodes 12 of the plurality of OLEDs may be formed on the first insulation layer 16 and the light-emitting layer 13. A corresponding structure is illustrated in FIG. 2. As shown in FIG. 2, the plurality of second electrodes 12 of the OLEDs may be electrically connected. The plurality of second touch-control electrodes 15 and the second electrodes 12 may be formed on a same layer.

The plurality of second touch-control electrodes 15 and the second electrodes 12 of the plurality of OLEDs may be formed by a patterning process. Specifically, a second material layer may be formed on the first insulation layer 16 and the light-emitting layer 13 and followed by patterning the second material. Thus, the plurality of second touch-control electrodes 15 and the second electrodes 12 of the plurality of OLEDs may be formed. In certain other embodiments, the plurality of second touch-control electrodes 15 and the second electrodes 12 of the plurality of OLEDs may be formed by a lift-off process.

The TFTs 20 may be bottom-gated TFTs. In certain other embodiments, the TFTs 20 may be top-gated TFTs. The TFTs 20 may be used to control the light-emitting of the OLEDs.

According to the disclosed embodiments, the module thickness of the OLED touch-control substrate formed by the disclosed methods may be relatively small, and the light transmittance may be relatively high. Further, because the first touch-control electrodes and the first electrodes of the OLEDs may be made of a same material; and the second touch-control electrodes and the second electrode may be made of a same material, it may not need extra masks and patterning processes. Thus, the production cost may be relatively low.

Figure 6:
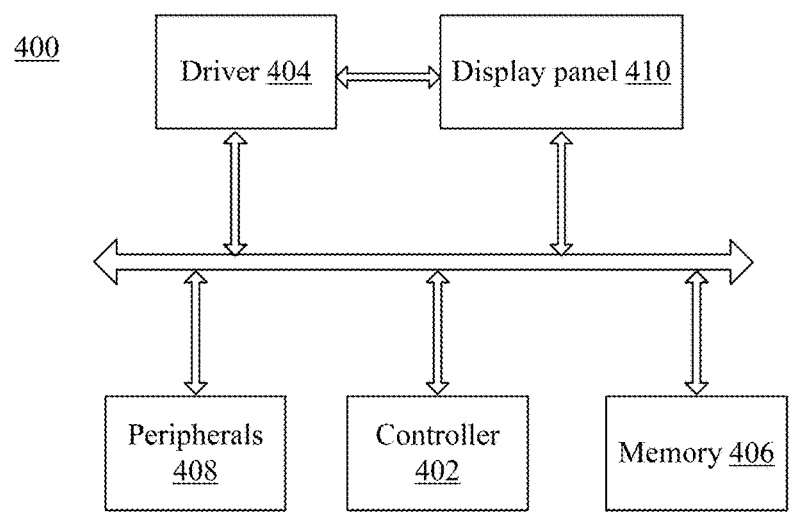
FIG. 6 illustrates a block diagram of an exemplary display apparatus according to the disclosed embodiments.

Further, according to the disclosed embodiments, a display apparatus is provided. FIG. 6 illustrates an exemplary display apparatus 400 incorporating at least a disclosed OLED touch-control substrate and other aspects of the present disclosure. The display device 400 may be any appropriate device, panel or component with certain display function, such as an OLED panel, an OLED TV, an OLED monitor, an OLED cell phone, an OLED navigation system, or e-paper, etc. As shown in FIG. 6, the display apparatus 400 includes a controller 402, a driver circuit 404, a memory 406, peripherals 408, and an OLED touch-control substrate 410. Certain devices may be omitted and other devices may be included.

The controller 402 may include any appropriate processor or processors. Further, the controller 402 can include multiple cores for multi-thread or parallel processing. The memory 406 may include any appropriate memory modules. The memory 406 may store computer programs for implementing various processes, when executed by the controller 402.

Peripherals 408 may include any interface devices for providing various signal interfaces. Further, peripherals 408 may include any input and output (I/O) devices. Peripherals 408 may also include any appropriate communication module for establishing connections through wired or wireless communication networks.

The driver circuitry 404 may include any appropriate driving circuits to drive the OLED touch-control substrate 410. During operation, the OLED touch-control substrate 410 may be provided with image signals by the controller 402 and the driver circuit 404 for display. Because the module thickness of the disclosed OLED touch-control substrate be relatively small, the light-transmittance may be relative high; and the production cost may be reduced, the display apparatus having such a OLED touch-control substrate may also have similar advantages.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. An organic light-emitting diode (OLED) touch-control substrate, comprising:
 a plurality of OLEDs in array with each spaced apart from each other, the plurality of OLEDs comprises a plurality of first electrodes with each spaced apart from each other, a plurality of second electrodes with each spaced apart from each other and a plurality of light-emitting layers with each spaced apart from each other, each of the OLEDs having a first electrode, a second electrode and a light-emitting layer between the first electrode and the second electrode;
 a plurality of first touch-control electrodes in a same layer with and insulated from the plurality of first electrodes; and
 a plurality of second touch-control electrodes in a same layer with and insulated from the plurality of second electrodes, the plurality of second touch-control electrodes insulated from and crossing with and insulated from the second electrode and the plurality of first touch-control electrodes,
 a first dielectric layer between the layer having the first touch-control electrodes and the first electrodes and the layer having the second touch-control electrodes and the second electrodes, the first dielectric layer being a continuous layer having via holes at positions corresponding to the light-emitting layers,
 wherein each light-emitting layer is completely in one corresponding via hole only.

2. The organic light-emitting diode (OLED) touch-control substrate according to claim 1, further comprising:
 a plurality of insulation blocks at cross positions of the first touch-control electrodes and the second touch-control electrodes.

3. The organic light-emitting diode (OLED) touch-control substrate according to claim 1, wherein:
 one first touch-control electrode is disposed between at least two adjacent first electrode lines; and
 one second touch-control electrode is disposed between at least two adjacent second electrode lines.

4. The organic light-emitting diode (OLED) touch-control substrate according to claim 1, wherein:
 the OLEDs comprise passive matrix OLEDs (PMOLEDs) having a plurality of first electrode lines and second electrode lines, the first electrode lines electrically connecting the first electrodes, and the second electrode line connecting the second electrodes;
 a plurality of first touch-control electrode lines are parallel to the plurality of first electrode lines and insulated from the plurality of the first electrode lines; and
 a plurality of second touch-control electrode lines are parallel to a plurality of second electrode lines and insulated from the second electrode lines.

5. The organic light-emitting diode (OLED) touch-control substrate according to claim 1, wherein:
 the OLEDs comprise active matrix OLEDs (AMOLEDs);
 the first touch-control electrodes are electrically insulated from the first electrodes of the AMOLEDs; and
 the second electrodes of the AMOLEDs are electrically connected.

6. The organic light-emitting diode (OLED) touch-control substrate according to claim 5, further comprising:
 a plurality of thin film transistors for controlling the plurality of OLEDs.

7. The organic light-emitting diode (OLED) touch-control substrate according to claim 5, further comprising:
 gate lines connecting to gates of the thin film transistors; and
 data lines connecting to sources of the thin film transistors.

8. The organic light-emitting diode (OLED) touch-control substrate according to claim 7, wherein:
 the first touch-control electrode lines are parallel to one of the gate lines and the data lines; and
 the second touch-control electrode lines are parallel to the other one of the gate lines and the data lines.

9. The organic light-emitting diode (OLED) touch-control substrate according to claim 1, wherein:
 the first electrodes are one of anodes and cathodes; and
 the second electrodes are the other one of anodes and cathodes.

10. The organic light-emitting diode (OLED) touch-control substrate according to claim 1, wherein:
 the first touch-control electrodes are driving electrode lines; and
 the second touch-control electrodes are sensing electrode lines.

11. A display apparatus comprising the OLED touch-control substrate according to claim 1.

12. A method for fabricating an organic light-emitting diode (OLED) touch-control substrate, comprising:
 forming a plurality of first touch-control electrodes and a plurality of first electrodes of a plurality of OLEDs insulated from the plurality of first touch-control electrodes in a same layer on a substrate;
 forming a continuous first insulation layer having a plurality of via holes corresponding to positions of a plurality of light-emitting layers of the OLEDs on the plurality of first touch-control electrodes and the plurality of first electrodes;
 forming the plurality of light-emitting layers completely in each of the via holes only on the plurality of first touch-control electrodes and the plurality of first electrodes; and
 forming a plurality of second touch-control electrodes and a plurality of second electrodes of a plurality of OLEDs insulated from the plurality of second touch-control electrodes in a same layer on the light-emitting layer;
 wherein:
 the plurality of OLEDs are in array with each spaced apart from each other;
 the plurality of OLEDs comprises a plurality of first electrodes with each spaced apart from each other, a plurality of second electrodes with each spaced apart from each other and a plurality of light-emitting layers with each spaced apart from each other; and
 the plurality of second touch-control electrodes insulated from and crossing with the plurality of the first touch-control electrodes.

13. The method according to claim 12, further comprising:
 forming a plurality of insulation blocks at cross positions of the first touch-control electrodes and the second touch-control electrodes.

14. The method according to claim 12, wherein:
 the OLEDs comprise passive matrix OLEDs (PMOLEDs) having a plurality of first electrode lines and second electrode lines, the first electrode lines electrically connecting the first electrodes, and the second electrode lines electrically connecting the second electrodes;

the plurality of first touch-control electrode lines are parallel to the plurality of first electrode lines and insulated from the plurality of the first electrode lines; and the plurality of second touch-control electrode lines are parallel to a plurality of second electrode lines and insulated from the second electrode lines.

15. The method according to claim 12, wherein:

the OLEDs comprise active matrix OLEDs (AMOLEDs);

the plurality of first touch-control electrodes are electrically insulated from a plurality of first electrodes of the AMOLEDs; and a plurality of second electrodes of the AMOLEDs are electrically connected.

16. The method according to claim 15, further comprising:

forming a plurality of thin-film transistors for controlling the OLEDs on the substrate; and forming a second insulation layer having a plurality of via holes corresponding to drains of thin-film transistors connecting the drains with the first electrodes.

17. The method according to claim 12, wherein:

the first electrodes are one of anodes and cathodes; and the second electrodes are the other one of anodes and cathodes.

18. The method according to claim 12, wherein:

the first touch-control electrodes are one of the driving electrodes and the sensing electrodes; and the second touch-control electrodes are the other one of the driving electrodes and the sensing electrodes.

* * * * *